(12) United States Patent
Bilbao De Mendizabal et al.

(10) Patent No.: US 10,895,600 B2
(45) Date of Patent: Jan. 19, 2021

(54) FAULT DETECTION

(71) Applicant: Melexis Technologies SA, Bevaix (CH)

(72) Inventors: Javier Bilbao De Mendizabal, Bevaix (CH); Vincenzo Sacco, Bevaix (CH)

(73) Assignee: Melexis Technologies SA, Bevaix (CH)

( * ) Notice: Subject to any disclaimer, the term of this patent is extended or adjusted under 35 U.S.C. 154(b) by 116 days.

(21) Appl. No.: 15/922,149

(22) Filed: Mar. 15, 2018

(65) Prior Publication Data

US 2018/0284190 A1 Oct. 4, 2018

(30) Foreign Application Priority Data

Mar. 30, 2017 (EP) .................................... 17163809

(51) Int. Cl.
| | | |
|---|---|---|
| *G01R 31/3193* | (2006.01) | |
| *G01D 3/08* | (2006.01) | |
| *G01R 31/28* | (2006.01) | |
| *G01R 33/07* | (2006.01) | |
| *G01R 33/00* | (2006.01) | |
| *G01R 35/00* | (2006.01) | |
| *G01R 31/3185* | (2006.01) | |

(52) U.S. Cl.
CPC ......... *G01R 31/31932* (2013.01); *G01D 3/08* (2013.01); *G01R 31/2829* (2013.01); *G01R 31/3185* (2013.01); *G01R 33/0041* (2013.01); *G01R 33/07* (2013.01); *G01R 35/00* (2013.01)

(58) Field of Classification Search
CPC ............ G01R 31/2829; G01R 31/3185; G01R 31/31932; G01R 31/0041
See application file for complete search history.

(56) References Cited

U.S. PATENT DOCUMENTS

| | | | |
|---|---|---|---|
| 4,896,525 A | 1/1990 | Breimesser | |
| 6,014,091 A | 1/2000 | Noltemeyer et al. | |
| 9,755,400 B2 * | 9/2017 | Seidel | ................... H01S 5/0652 |
| 2006/0056500 A1 * | 3/2006 | Motz | ................... G01R 31/2829 |
| | | | 375/224 |
| 2010/0277736 A1 * | 11/2010 | Goebel | ..................... F16P 1/06 |
| | | | 356/434 |
| 2012/0168901 A1 * | 7/2012 | Santangelo | ............. H01L 23/48 |
| | | | 257/531 |
| 2016/0282399 A1 | 9/2016 | Veroni | |
| 2017/0213867 A1 * | 7/2017 | Roos | ................. H01L 27/14658 |
| 2018/0188176 A1 * | 7/2018 | Peumans | ............ G01N 21/1717 |

FOREIGN PATENT DOCUMENTS

| | | |
|---|---|---|
| WO | 2014049130 A1 | 4/2014 |
| WO | 2014149416 A2 | 9/2014 |

OTHER PUBLICATIONS

Extended European Search Report from EP Application No. EP 17 16 3809, dated Aug. 22, 2017.

* cited by examiner

*Primary Examiner* — Jigar P Patel
(74) *Attorney, Agent, or Firm* — Workman Nydegger (57) ABSTRACT

A method for detecting a fault in a sensor arrangement is described. The method comprising modulating at least one physical parameter of the sensor arrangement by a configuration value, wherein the at least one physical parameter of the sensor arrangement is modulated during operation of the sensor arrangement, comparing an output of the sensor arrangement with a reference output related to the modulated at least one physical parameter and detecting a fault based on the comparison. Furthermore, also a corresponding processing circuit is described.

18 Claims, 4 Drawing Sheets

FAULT DETECTION

TECHNICAL FIELD

The current application concerns a method, an apparatus and a system for fault detection of a sensor arrangement, in particular fault detection during operation of the sensor arrangement.

BACKGROUND

In order to guarantee a high standard of safety, integrated circuits and in particular, sensor arrangement need to be verified and constantly monitored to assure that they are working properly. This is necessary to ensure that the systems depending on the measurements taken by the sensor arrangement are receiving correct measurements, i.e. sensor values. Although the highest quality assurance standards and design awareness are put into the development of sensor arrangements, malfunctions over the lifespan of the sensor arrangement are nearly inevitable.

For safety reasons, sensor arrangements are tested prior to installation, e.g. in a laboratory or during the manufacturing process. However, after installation the test opportunities to ensure that the sensor arrangement is operating properly is limited. During operation, a fault is simply detected by the absence of the respective measurements of the sensor arrangement. However, this represents the limitation that insidious faults cannot be detected and as such, a fault can only be detected when it is too late.

Since functional safety in recent years has shifted more and more into focus of developers and applicants of sensor arrangements, methods and apparatuses have been developed, which allow a testing of sensor arrangements also during operation of the sensor arrangements. These methods or apparatuses basically use an on-chip produced predetermined stimuli for the sensor arrangement and compare the output of the sensor arrangement produced by the predetermined stimuli with an output expected to be encountered with the respective predetermined stimuli. If a match is encountered, it is determined that the sensor arrangement is working within its normal operating conditions. If a mismatch is encountered, it is determined that the sensor arrangement is not working within its normal operating conditions and it is likely that a fault is detected. The test with the predetermined stimuli can be performed either on an intermittent basis, i.e. only in specific time intervals or when the sensor arrangement is not in use, because the stimuli would interfere with the physical quantity to be measured.

An example of such a self-testing sensor arrangement is described in WO 2014/149416 A2, which describes a sensor arrangement, which comprises a magnetic field sensor having an externally accessible coil. The external accessible coil is used to produce a predetermined stimuli for the magnetic field sensor, i.e. a predetermined magnetic field, such that by ease of the predetermined stimuli the proper functionality of the magnetic field sensor can be tested.

However, these kind of tests have the disadvantage that on the one side only the actual sensing element of the sensor arrangement can be tested and not also the read out chain connected to the sensor arrangement. Furthermore, additional hardware is required, which itself can malfunction. Also, the additional hardware would need to be supplied with power, which in power critical applications may be a problem. The applied stimuli can also have impacts on other systems, which need to be factored in. It may also be a problematic that the testing with the applied stimuli may only be performed when the sensor arrangement is not in use, i.e. in idle times.

Hence, the objective technical problem of the current application is to overcome the disadvantages of the known prior art and provide improved fault detection during operation of a sensor arrangement. In particular, a fault detection with which it is possible to detect all deviations of the sensor arrangement as well as the read out chain, without having to implement further complex hardware, which by itself may malfunction.

SUMMARY

This problem is solved by the method, apparatus and system according to the independent claims of the current application.

A method according to the invention comprises modulating at least one physical parameter of the sensor arrangement by a configuration value, wherein the at least one physical parameter of the sensor arrangement is modulated during operation of the sensor arrangement. The physical parameter may for example be modulated to discrete predetermined configuration values. The aforementioned discrete configuration values may deviate from each other by a predetermined percentage. It may also be contemplated that the configuration values are randomly selected based on a transfer function.

The sensor arrangement may comprise at least one or a set of sensing elements. These sensing elements may operate in a differential or non-differential manner. As such, it can also be said that the sensor arrangement is a differential sensor arrangement, or a non-differential sensor arrangement, or a hybrid sensor arrangement, when some of the sensing elements operate in a differential manner and others do not. A sensing element converts a physical quantity, e.g. a magnetic field strength, into an electrically measurable signal that is proportional to the physical quantity measured. The sensing element thereby can be characterized by a physical parameter, which is used to convert the physical quantity into an electrically measurable signal. For example, if the sensing element is used to sense a property of a magnetic field, a Hall sensing element also often called a Hall plate can be used. In this case the physical parameter of the Hall sensing element may be the bias current of the Hall sensing element. It is however clear that this is only mentioned for exemplary purposes and in other sensor arrangements the physical parameter of the sensing element may be a different parameter. Furthermore, it is clear that the sensor arrangement may comprise a set of sensing elements, which may be of the same type or of a different type. As such, a sensor arrangement may comprise different types of sensing elements, which also may possess different physical parameters, which may be modulated. Also, each sensing element may not only possess one physical parameter which may be modulated, but several. If a sensor arrangement is a differential sensor arrangement, the sensing elements of the sensor arrangement can be adapted to provide an output which is free of undesired effects through the process of subtraction of the individual outputs of the sensing elements. This subtraction can either be performed by processing or by hardwiring of the sensing elements.

The method according to the invention also comprises comparing an output of the sensor arrangement with a reference output related to the modulated at least one physical parameter. As such, when the at least one physical parameter of the sensor arrangement is modulated, this causes a specific alteration of the sensor arrangement and as such in turn a specific alteration of the output, i.e. the conversion of the physical quantity sensed by the sensor arrangement is specifically altered due to the modulation of the physical parameter. When the sensor arrangement works properly, the alteration is deterministic, i.e. foreseeable and follows a specific transfer function. As such, the modulation of the physical parameter of the sensor arrangement should lead to foreseeable results, i.e. a predictable reference output, which is expected to be seen when the physical parameter is modulated. Thereby, the output can comprise a useable signal and an offset, which both may be influenced when the physical parameter is modulated. Both may be altered equally or differently. Thereby, the useable signal is dependent upon the measured physical quantity, whereas the offset is an inherent quantity of the sensor arrangement. As such, when the physical quantity to be sensed by the sensor arrangement varies slowly in time then the useable signal as well as the offset can be encompassed by the reference output and compared to the output encountered with the modulated physical parameter. However, if the physical quantity to be measured is highly variable in time, then only the offset may be used as reference output. It is clear to a person skilled in the art that it is here restricted to the offset comparison, since the useable signal is in highly variable systems not predictable, whereas the offset as an inherent characterization of the sensor arrangement is predictable. It is contemplated that if also parts of the useable signal are predictable, for example, because they have a time wise characteristic, then also these parts may be used together with the offset or even instead of the offset.

The reference output can be an output, which is modelled or initially generated with the sensor arrangement under test conditions in a laboratory when the modulated physical parameter is used and may be stored, such that it can be compared to the actual output generated by the sensor arrangement when using the modulated physical parameter again. For example, the reference output may be stored in a lookup table indexed by the configuration value used for the physical parameter modulation. Thereby, the lookup table may be stored in a memory accessible to a processing circuit connected to the sensor arrangement. However, it is also contemplated that the reference output is an output, which was taken by the sensor arrangement a time instance preceding the one where the output is taken and the reference output is latched until the output is taken.

It is also possible that the reference output actually is also an output generated by the sensor arrangement, but with a different configuration value as the one used to generate the output. In other words, the output may be a modulated output using a modulation of a first physical parameter of the sensor arrangement with a first configuration value and the reference output may be a modulated output using a modulation of the first physical parameter of the sensor arrangement, but with a second configuration value. If the sensor arrangement is working properly, the change between the output and the reference output is deterministic, i.e. follows a specific known transfer function.

Furthermore, it is also possible that the output may be a modulated output using a modulation of a first physical parameter of the sensor arrangement and the reference output may a modulated output using a modulation of a second physical parameter of the sensor arrangement. If the sensor arrangement is working properly, the change between the output and the reference output is deterministic, i.e. follows a specific known transfer function.

Also, it is possible that not the direct output of the sensor arrangement may be compared with a reference output, but a processed output of the sensor arrangement is compared with a processed reference output. In this case the same processing may be applied to the output of the sensor arrangement as used to create the reference output or a different processing is used. If the processing performed with the direct output of the sensor arrangement and the processing used to generate the reference output is known and the sensor arrangement works properly, the alteration of the physical parameter by the configuration value is deterministic, i.e. foreseeable and follows a specific transfer function. For example, the direct output of the sensor arrangement can be used to calculate an angle of a rotating object emitting a magnetic field in the vicinity of the sensor arrangement. The calculation of the angle is thereby dependent upon a processing, e.g. forming a quotient, of the output of the sensing elements of the sensor arrangement. By using this processing, the influence of a modulated physical parameter is cancelled out; such that the predictable behavior is that the modulation of the physical parameter shall have no influence on the angle determination. As such, if the reference output is one angle measured with one physical parameter, then the same angle shall also be outputted with another physical parameter used, at least under the premises that the object has not moved. As such, it is contemplated by a person skilled in the art that an output in the meaning of the invention can either be constituted by the direct outputs of the sensing elements of the sensor arrangement, or by the processed direct outputs of the sensing elements, the same is also valid for the reference output. It can also be said that the output is one, which is calculated from the direct outputs of the sensing elements of the sensor arrangement, same is also valid for the reference output.

Hence, by ease of the comparison between the output and the reference output, it can be detected whether the sensor arrangement is working properly or a fault is encountered. By ease of the comparison also insidious faults can be detected, since the amount of deviation from the deterministic behavior gives a measure of faultiness. For example, if it is expected that the output matches the reference output, but it does not, then the deviation gives an indication of the degree of faultiness of the sensor arrangement. Also, if a particular behavior shall be encountered when changing from one configuration value to another or from one physical parameter to another and a deviation from this expected behavior is encountered, then the amount of deviation gives an indication of the degree of faultiness of the sensor arrangement.

The method according to the invention allows a fault detection of a sensor arrangement during operation of the sensor arrangement without having to implement further testing hardware. This is achieved by using the measurements which are anyhow taken by the sensor arrangement also for testing purposes.

In one embodiment, the method may further comprise generating a status bit based on a detected fault. As such, if a fault is detected in the sensor arrangement, this fault may be flagged by setting a status bit corresponding to the fault. Thereby, the status bit may be stored in the sensor arrangement or a memory connected to the sensor arrangement. It is also possible that the status bit is stored in a processing circuit connected to the sensor arrangement or a respective memory of the processing circuit or connected to the processing circuit. This status bit itself can either be read out of the memory it is stored in by another entity, for example, on a regular basis to get knowledge about any faults. For example, the another entity may have a cyclic fault check implemented, which in predetermined intervals reads out the status bit and when this status bit is set to indicate that a fault has been encountered, then the another entity takes respective actions. Alternatively or additionally, the status bit may also be sent to another entity to inform the entity about the fault. Thereby, either only when a fault is detected, the status bit may be sent to the another entity, or on a constant basis the status bit may be sent to the another entity, whereby one state of the status bit may indicate that no fault is detected and another state of the status bit may indicate that a fault has been detected. The another entity can based on the change of the state of the status bit identify that a fault has occurred. For example, the status bit may be in a logic high state "1" when no fault has occurred and in a logic low state "0" when a fault has occurred, or vice versa. The status bit may also be referred to as an error bit.

In one further embodiment, the modulation of the at least one physical parameter of the sensor arrangement with a configuration value comprises modulating a first physical parameter with a first configuration value for a first predetermined time period and modulating the first physical parameter with a second configuration value for a second predetermined time period. Thereby, the time periods may have the same lengths or different lengths. Using such a step behavior in the modulation of the physical parameter allows simple comparisons. Thereby, for example the first and the second time period may be in the order of 1000 ms. However, the concrete time periods and as such the modulation frequency between configuration values defined by the time periods depends on the sensor arrangement and the sensing elements of the sensor arrangement. It is also contemplated that the configuration value is only modulated at start-up of the sensor. The difference between the first configuration value and the second configuration may be equal or less than 10%, in order not to produce spike outputs, which may themselves be regarded as faults. The physical parameter may also constantly be modulated with different configuration values over time. Also, the configuration value may follow a specific function in time, e.g. may be changed in a sinusoidal way or may follow another predetermined function. Thereby, changing between configuration values exhibits the advantage that faults over the entire operating range of the sensor arrangement can be detected. This allows to test the sensor arrangement over its entire operational range.

In one further embodiment, the modulation of the at least one physical parameter of the sensor arrangement with a configuration value comprises modulating a first physical parameter for a first predetermined time period and modulating a second physical parameter for a second predetermined time period. Thereby, the time periods may have the same lengths or different lengths. Furthermore, the first and second physical parameter may be modulated with the same or different configuration values. It may be constantly switched between the physical parameters, in order also to detect specific faults, which may only occur at one specific configuration of the sensor arrangement. The same may also be done for the configuration values used for the physical parameters. This allows to test the sensor arrangement over its entire operational range.

In one further embodiment, a fault is detected, when the output differs from the reference output by more than a predetermined threshold. The amount of deviation thereby can give an indication of the degree of faultiness in the sensor arrangement. For example, a deviation of 3 to 5% may be regarded as no fault, whereas a 10% deviation may be regarded as a fault.

In one further embodiment, the comparing of the output of the sensor arrangement with the reference output of the sensor arrangement comprises comparing a set of outputs of the sensor arrangement with a set of reference outputs. As such, not a single output is compared to a single reference output, but several outputs are compared to several reference outputs. Thereby, a one to one comparison can be performed or the mean of the several outputs can be compared to a mean of the reference outputs. It is also possible to compare the progression of the several outputs over time with the progression of the reference outputs over time. If deviations are detected between the progressions, it can be determined that the sensor arrangement is not working linear. For such kind of linearity check, several modulations of the physical parameter over time can be used and the respective outputs of the sensor arrangement can be compared to reference outputs. For example, at a first predetermined time at least one physical parameter can be modulated with a first configuration value, at a second predetermined time the at least one physical parameter can be modulated with a second configuration value and at a third predetermined time the at least one physical parameter can be modulated with a third configuration value (that is usually but not necessarily the same as the first configuration value). It can be determined that a non-linearity is encountered, when the difference between the outputs of the sensor arrangement at the first and second predetermined times in comparison to the difference between the outputs of the sensor arrangement at the second and third predetermined times deviate by more than a predetermined threshold. In other words, the output of the sensor arrangement at the predetermined first time is subtracted from the output of the sensor arrangement at the predetermined second time, or vice versa. Furthermore, the output of the sensor arrangement at the predetermined second time is subtracted from the output of the sensor arrangement at the predetermined third time, or vice versa. The results of these two subtractions is then compared and if they deviate by more than a predetermined threshold, it is determined that the sensor arrangement is not operating linearly and as such a fault is detected. In this case the foreseeable reference output is the result of the subtractions or the result of the comparison, which shall be below a predetermined threshold. A person skilled in the art will recognize that even so the linearity check in the aforementioned example is described using only three distinct time instances, several time instances and as such several modulations of the at least one physical parameter may be used to check the linearity. Furthermore, even so it is described that only at least one physical parameter is modulated at the different time instances, i.e. the same at least one physical parameter, it may also be possible to modulate different physical parameters at the different time instances, in particular when the transfer function is known and as such the behavior of the output of the sensor arrangement between two time instances is predictable.

Furthermore, a fault of the sensor arrangement can also be detected, if the progression of the outputs in comparison to the reference outputs exhibit spikes, these spikes can be detected as a fault. If a threshold number of spikes is encountered, it can be determined that the sensor arrangement is faulty. As such, for every detected deviation—e.g. for every error—a flag can be generated, for example in the memory of the processing circuit, and if the number of flags exceeds a specific threshold, i.e. a spike in the number of fags is encountered, a fault is detected and signaled. This exhibits the advantage that not for every deviation between the output and the reference output a fault is signaled, but only when the frequency of occurrence exceeds a predetermined threshold. Also, a person skilled in the art will recognize that by having several outputs and several reference outputs, time analysis or statistical algorithms can be used, which may flag conspicuous deviations between the outputs and the reference outputs in order to detect a fault. Thereby, a hysteresis may be used, e.g. only if a specific number of faults in a specific amount of time is encountered, a fault is detected.

The above-mentioned objective technical problem is also solved by a processing circuit, for example a digital signal processing chip, wherein the processing circuit comprises means for modulating at least one physical parameter of a sensor arrangement by a configuration value, wherein the at least one physical parameter of the sensor arrangement is modulated during operation of the sensor arrangement, means for comparing an output of the sensor arrangement with a reference output related to the modulated at least one physical parameter and means for detecting a fault based on the comparison.

In one embodiment of the processing circuit, the means for modulating the at least one physical parameter may be adapted to continuously, i.e. all the time, modulate the at least one physical parameter during operation. Alternatively, the means for modulating the at least one physical parameter may be adapted to only intermittently modulate the at least one physical parameter. Thereby, intermittently means that the modulation is performed only at predetermined points in time, for example on a recurring time basis. It may also be contemplated that the means for modulating the at least one physical parameter is adapted to modulate the physical parameter only at start-up of the sensor arrangement. This modulation may then either be performed just one time or for a predetermined period of time at the start-up of the sensor arrangement.

In one further embodiment of the processing circuit, the means for modulating the at least one physical parameter may be adapted to modulate different physical parameters at different times and/or use different configuration values at different times. For example, the means for modulating may be adapted to modulate a first physical parameter with a first configuration value during a first period of time and to modulate the first physical parameter with a second configuration value during a second period of time. Also, the means for modulating may be adapted to modulate a first physical parameter during a first period of time and to modulate the second physical parameter during a second period of time. Thereby, the first and second physical parameter may be modulated using the same or different configuration values.

In one further embodiment of the processing circuit, the means for modulating the at least one physical parameter may be adapted to modulate different physical parameters at the same time. Thereby, the means for modulating may be adapted to modulate a first physical parameter using a first configuration value and modulating a second physical parameter using a second configuration value. The first and second configuration values can be the same or different configuration values.

In one further embodiment of the processing circuit, the processing circuit may further comprise means for generating a status bit based on the detected fault. This status bit may either be stored in the processing circuit or a memory accessible by the processing circuit. By storing the status bit in the memory, another entity will be able to read out this status bit and as such will be able to identify the fault situation of the sensor arrangement and take respective actions. Also, the processing circuit may comprise means for transmitting the status bit directly to another entity in order to inform the another entity about the occurred fault, such that the another entity can take respective actions. Thereby, the means for transmitting can be adapted to constantly transmit the status bit to the another entity, wherein one state of the status bit may indicate that no fault has occurred and another state may indicate that a fault has occurred.

The above-mentioned objective technical problem is also solved by a system comprising the aforementioned processing circuit and a sensor arrangement. Thereby, the system may also be referred to as sensor chip. The processing circuit and the sensor arrangement may be implemented on the same semiconductor substrate.

The sensor arrangement may comprise at least one magnetic sensing element or a bridge circuit. The magnetic field sensing element may be at least one Hall sensing element or at least one magnetoresistance sensing element. As Hall sensing elements, horizontal Hall sensing elements or vertical Hall sensing elements may be used. Thereby, horizontal Hall sensing elements are responsive to the magnetic field components perpendicular to the semiconductor substrate on which the Hall sensing element is implemented, whereas vertical Hall sensing elements are responsive to magnetic field components parallel to the semiconductor substrate. By using one or several magnetic concentrators, the horizontal Hall sensing elements can also be made responsive to magnetic field components parallel to the semiconductor substrate, since magnetic concentrators are capable of redirecting the magnetic field to be measured. As magnetoresistance sensing elements, for example, Anisotropic Magneto Resistance (AMR), Giant Magneto Resistance (GMR), or Tunneling Magneto Resistance (TMR) can be used. It shall also be contemplated that a combination of different magnetic field sensitive elements can be used. The magnetic field sensing elements measure a magnetic field property of the magnetic field applied to the magnetic field sensing element. At any given point a magnetic field is specified by both a direction and a strength, as such it is a vector field, wherein the magnetic field property may be the direction or strength of the vector field or a component of the vector field. A magnetic field property may as such be the strength of the magnetic field along a certain direction, for example, along the coordinate axes of a Cartesian, cylindrical or spherical coordinate system or along any direction described by a combination of those coordinates. Using a Cartesian coordinate system as reference, the vector field can at any given point be expressed by the three components of the magnetic field, namely Bx, By, and Bz. The magnetic field sensitive elements can measure one of these components or a combination of the components and convert the respective magnetic field property or magnetic field quantity into an electrically measurable signal. The magnetic field sensing elements as such can be able to measure the magnetic field strength parallel or perpendicular to a surface of the semiconductor substrate. Also, the magnetic field sensing elements may measure the radial or tangential component of a magnetic field.

In one further embodiment of the system, the sensor arrangement may comprise at least one pressure sensing element or at least one current sensing element.

In one further embodiment of the system, the system may comprise a readout chain between the sensor arrangement and the processing circuit. The readout chain transfers the electrically measurable signal of the at least one sensing element of the sensor arrangement into a voltage or current proportional to the sensed physical quantity. The readout chain may comprise switches to switch between different sensing elements of the sensor arrangement. Furthermore, the readout chain may comprise at least one amplifier and/or an integrator, at least one analog to digital converter and at least one processing circuit, for example in form of a digital processing circuit.

BRIEF DESCRIPTION OF THE DRAWINGS

The following description and the annexed drawings set forth in detail certain illustrative aspects of the method, apparatus and system above. These aspects are indicative, however, of but a few of the various ways in which the principles of various embodiments can be employed and the described embodiments are intended to include all such aspects and their equivalent.

In the drawings, like reference characters generally refer to the same parts throughout the different drawings. The drawings are not necessarily to scale, emphasis instead generally being placed upon illustrating the principles of the invention.

In the following description, various embodiments of the invention are described with reference to the following drawings, in which.

DETAILED DESCRIPTION

The following detailed description refers to the accompanying figures that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1A:
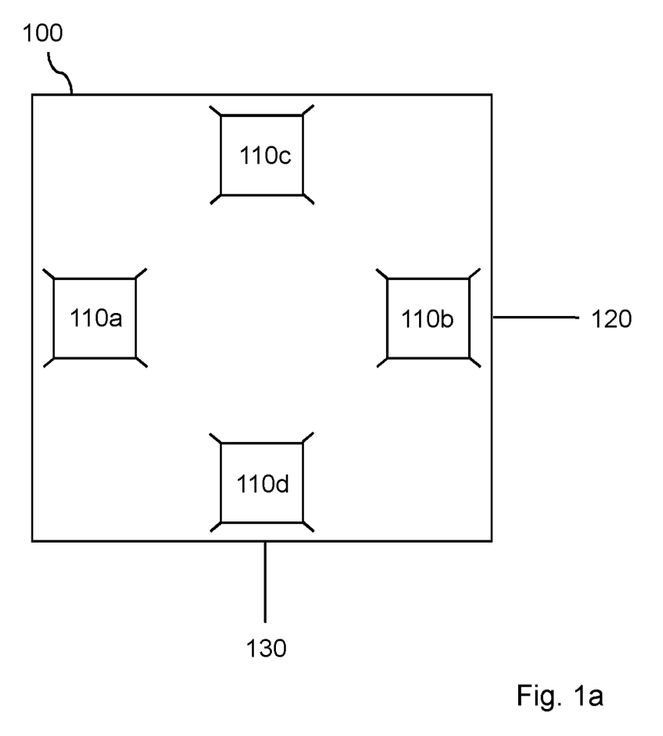
FIG. 1a shows a plan view of a sensor arrangement according to one embodiment example of the invention.

FIG. 1a shows a plan view of a sensor arrangement 100 according to one embodiment example of the invention. In the here shown embodiment example, the sensor arrangement 100 comprises four sensing elements 110a-d, wherein the four sensing elements 110a-d in the here shown embodiment example are Hall sensing elements. As such, the Hall sensing elements 110a-d of the sensor arrangement 100 are able to sense or measure a magnetic field property of a magnetic field influencing the respective Hall sensing elements 110a-d. The Hall sensing elements 110a-d are thereby able to convert the physical magnetic field property, like the magnetic field strength, into an electrically measurable output signal. This electrically measurable output signal in case of Hall sensing elements 110a-d is also often called a Hall voltage. This Hall voltage is produced across the Hall sensing elements 110a-d transverse to an electric current applied to the Hall sensing elements 110a-d and a magnetic field perpendicular to the current. If one Hall sensing element 110a-d is considered, a physical parameter of the Hall sensing element 110a-d, is on the one hand the bias current applied to the Hall sensing element 110a-d and the sensitivity of the Hall sensing element 110a-d. The output of the Hall sensing element 110a-d can be described as $V_{Hall}=I_{bias}$ S B+$V_{offset}$, wherein $V_{Hall}$ is the Hall voltage, $I_{bias}$ is the bias current applied to the Hall sensing element, S is the sensitivity of the Hall sensing element, B is the applied magnetic field, and $V_{offset}$ is the voltage that is measured when no magnetic field is applied. The Hall voltage is as such proportional to the physical parameters of the Hall sensing element 110a-d, which are the bias current $I_{bias}$ and the sensitivity S. If one or both physical parameters are modulated, the output of the Hall sensing element 110a-d is modulated. For example, the bias current of the Hall sensing element 110a-d may be modulated and set to a specific value given by a configuration value 130. The configuration value 130 may as such also directly be the respective bias current, which shall be applied to the Hall sensing element 110a-d. Even so in the here shown embodiment example only one configuration value 130 is led to the sensor arrangement 100, it is contemplated that also several configuration values 130 may be led to the sensor arrangement 100, e.g. one for each Hall sensing element 110a-d of the sensor arrangement 100. Thereby, it the different configuration values 130 may the same or differ from each other.

Due to the known behavior of the Hall sensing element 110a-d as given by the aforementioned equation, the behavior change in the Hall voltage due to the change in the bias current, i.e. in the physical parameter, is known or at least predictable. As such, the output can be compared to a reference output, which is the predicted output and when a mismatch occurs or the two outputs differ by more than a predetermined threshold, then it can be detected that a fault has occurred.

Furthermore, in the art also $V_{offset}$ cancellation techniques are known, which reduce or substantially eliminate the $V_{offset}$ of a Hall sensing element 110a-d, wherein these techniques are independent from the bias current applied or the sensitivity of the Hall sensing element 110a-d, since the influence of these physical parameters is more or less cancelled out when applying the $V_{offset}$ cancellation techniques. As such, when a physical parameter is modulated during operation of the Hall sensing element 110a-d, still the $V_{offset}$ should be substantially reduced or cancelled. This is a predictable behaviour, which can be used to detect a fault. If during modulation of a physical parameter the $V_{offset}$ cancellation fails, a fault is detected. In this case, the output does not match the reference output, since the output still comprises the $V_{offset}$, whereas the predicted reference output should not comprise the $V_{offset}$.

A person skilled in the art will contemplate that also when the physical parameter modulation is here described in context of a single Hall sensing element 110a-d, the same principle also applies to sensor arrangements 100 comprising more than one Hall sensing element 110a-d—as shown in the here depicted embodiment example—or even comprising other sensing elements, where physical parameters can be modulated.

Furthermore, a person skilled in the art will recognize that the comparison of an output signal with a reference output can not only be performed on a single sensing element basis, but also on a basis that the different sensing elements of a sensor arrangement 100 contribute all to a common output.

In the here shown embodiment example, the sensor arrangement comprises four Hall sensing elements 110a-d. The physical parameter of all four Hall sensing elements 110a-d can be modulated individually and the output of each Hall sensing element 110a-d can be compared with a reference output for the individual Hall sensing element 110a-d. It is however also possible that all the individual Hall sensing elements 110a-d contribute to a specific output and this specific output 120 can be compared to a reference output. The specific output 120 can thereby either be the direct output of the individual Hall sensing elements 110a-d, e.g. their measured Hall voltages, or the specific output 120 of the sensor arrangement 100 can be a processed output, for example, an output calculated from the direct output of the individual Hall sensing elements 110a-d, for example, the angle of a bar magnet arranged in the vicinity of the sensor arrangement 100 as shown in FIG. 1b, wherein the angle is calculated from the direct output of the individual Hall sensing elements 110a-d.

Figure 1B:
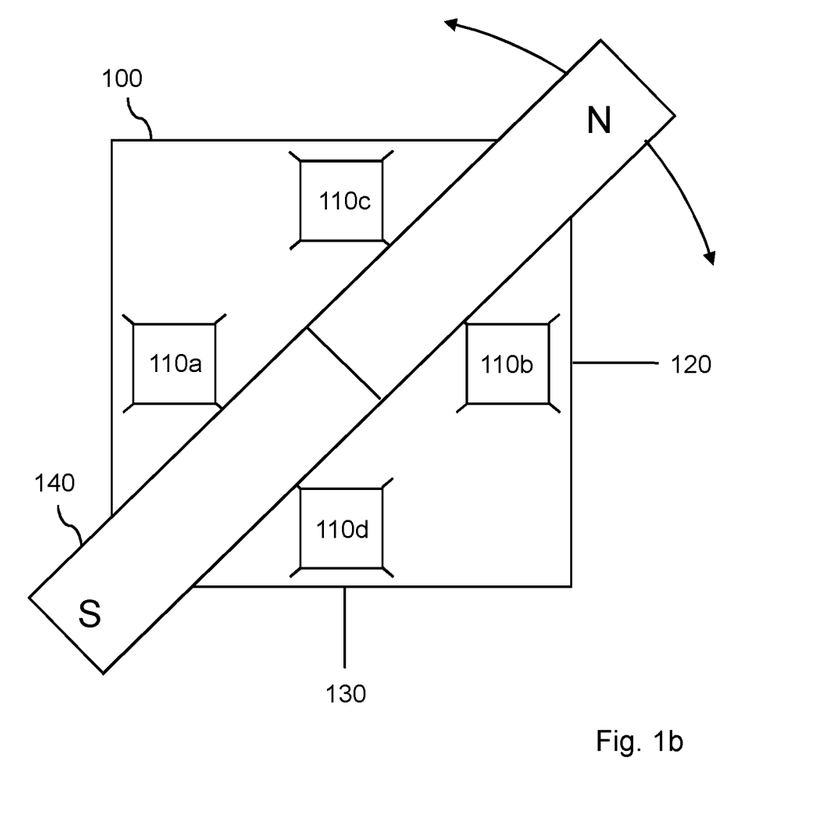
FIG. 1b shows a plan view of the sensor arrangement of FIG. 1a, with a bar magnet which angular position is determined with the sensor arrangement.

FIG. 1b shows a plan view of the sensor arrangement 100 of FIG. 1a, with a bar magnet 140 which angular position is determined with the sensor arrangement 100. The Hall sensing elements 110a-d of the sensor arrangement 100 can be arranged in a cross shape formation. Thereby, pairs can be formed by opposing Hall sensing elements 110a-d. For example, Hall sensing elements 110a and 110b may form one pair and Hall sensing elements 110c and 110d may form another pair. For both pairs the difference of their respective Hall voltages may be formed. If then the arcus tangents of the quotient of these differences is formed, this yields to the angular position of the bar magnet 140 rotating over the sensor arrangement 100. This angular position determination is independent of the physical parameter of the Hall sensing elements 110a-d, since these parameters cancel each other out, when the quotient is formed. As such, even if the physical parameters are modulated, they should not lead to a change in the output as compared to a reference output, i.e. an expected output. However, if with the modulated physical parameters a deviation of the output and a reference output is encountered, it can be determined that a fault has occurred. As such, if the output 120 of the sensor arrangement 100 deviates from a reference output by more than a predetermined threshold during the modulation of the physical parameters of the Hall sensing elements 110a-d by ease of a configuration value, then a fault is detected.

Even so FIG. 1b shows exemplarily Hall sensing elements 110a-d in a cross configuration, it is contemplated that also other arrangements are possible. Furthermore, also the four depicted Hall sensing elements 110a-d shall not be regarded as limiting and any number of Hall sensing elements 110a-d may be used.

Furthermore, even so the principles of the current invention are described in context of Hall sensing elements 110a-d and as such based on the sensing of a magnetic field, a person skilled in the art will readily appreciate that the technique described herein can also be applied to other sensing elements, which physical parameters can be modulated. For example, the method and techniques described herein can also be used for differential current sensors and angle sensors. The latter for example according to the sensor arrangement shown here, may have at least four Hall sensing elements. However, also other sensor arrangements are contemplated in which the method and techniques of the current invention may be employed.

While the embodiment example of FIGS. 1a and 1b is described mainly for determining a single angular position around a single axis, it will be understood that the same principles can also be applied to determine a position on a linear axis. This can for example be done by providing a magnet rail for providing a sinusoidal signal, and by using at least two Hall sensing elements 110a-d located on a quarter wavelength apart, or by measuring two orthogonal magnetic components. But other variants are also possible, for example to use two longitudinal magnet rails with a different period, and to use at least two Hall sensing elements 110a-d for each of them, and using the nonius-scale principle in the calculation of the position.

As such, in the following, it will only be referred to a sensor arrangement in general and it shall be contemplated that this sensor arrangement may comprise any type and number of sensing elements, which physical parameters may be changed by a configuration parameter.

Figure 2:
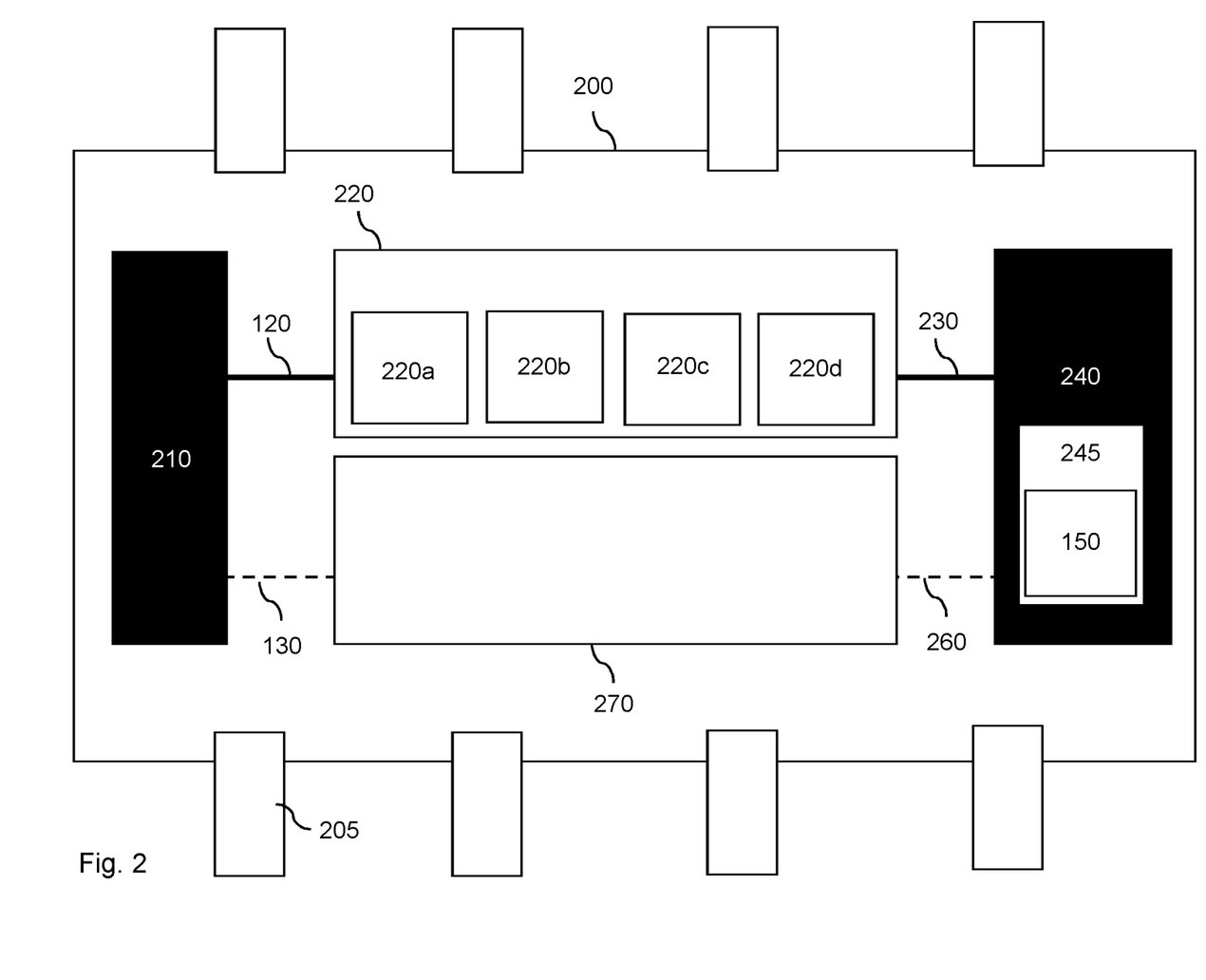
FIG. 2 shows a plan view of a system comprising a sensor arrangement and a processing circuit according to one embodiment example of the invention.

FIG. 2 shows a plan view of a system 200, also often referred to as a sensor chip, wherein the system 200 comprises a sensor arrangement 210 and a processing circuit 240 according to one embodiment example of the invention.

The sensor chip 200 may also comprise contacts 205, with which the sensor chip 200 can be connected to circuit boards and with which signals can be inputted and outputted from and to the sensor chip 200. The contacts 205 can also be used to supply the sensor chip 200 with a supply voltage or a current, respectively.

The sensor arrangement 210 is adapted to convert a physical quantity sensed or measured into an electrically measurable signal 120. This signal 120 can also be referred to as an output 120 of the sensor arrangement. This output 120 may be led to a readout chain 220, which may comprise means for pre-processing or pre-conditioning the output 120. For example, in the here shown embodiment example, the readout chain may comprise a switch 220a for switching between the individual outputs of the sensing elements of the sensor arrangement, a serial to parallel converter 220b, an amplifier 220c, and an integrator 220d. As will be recognized by a person skilled in the art, these elements of a readout chain 220 are only exemplarily mentioned and do not constitute a full list of elements of a readout chain 220, but shall also not limit the elements of the readout chain 220, such that a readout chain 220 may comprise more or less elements depending on the implementation. The readout chain 220 outputs a signal 230 to the processing circuit 240. The processing circuit 240 may be a digital signal processor, which may comprise a memory 245. The processing circuit 240 may further process the output signal 230. Also, the processing circuit 240 may compare the output signal 230, which is based on the output 120 of the sensor arrangement 100, with a reference output 150 stored in the memory 245 of the processing circuit 240. Also, if in the here shown embodiment example, the memory 245 is part of the processing circuit 240, a person skilled in the art will recognize that the memory 245 can also be located separate from the processing circuit 240 and in fact may even be implemented off the sensor chip 200 itself, but may be accessible by the processing circuit 240. If the processing circuit 240 determines that the output 230 and the reference output 150 match or only differ from one another by a predetermined threshold, then the processing circuit determines that the sensor arrangement 100 is operating without a fault. If a deviation is detected by the processing circuit 240, a fault is detected. In this case, the processing circuit 240 may generate or set a status bit in the memory 245. Thereby, even so in the here shown embodiment example, the status bit is generated and stored in the memory 245 of the processing circuit 240, it is contemplated that this status bit may also be stored in another memory, which may be implemented on the sensor chip 200 or may just be accessible by the processing circuit 240. This status bit can either be read out by another entity or can be signaled to another entity. The status bit as such flags if a fault has been detected or not. A person skilled in the art will recognize that there are different options how the fault detection can be indicated to another entity. For example, the processing circuit 240 can sent the status bit to the another entity. It is also possible that the processing circuit 240 always sends a signal to the another entity, wherein this signal has a predetermined logical state. When a fault is detected, the processing circuit 240 may change the logical state of this signal, such that the another entity can identify that a fault has occurred and has been detected by the processing circuit 240.

The processing circuit 240 is also adapted to actually cause the physical parameter modulation of the sensor arrangement 210, as such the processing circuit 240 is responsible for the functional safety testing. For this purpose, the processing circuit 240 may output a control signal 260, which controls a control unit 270, which takes care of controlling the physical parameter of the sensor arrangement 210 by ease of the configuration value 130. When considering the embodiment example of FIGS. 1a and 1b, the control unit 270 may modulate the bias current of the sensitivity of the Hall sensing elements 110a-d. Thereby, the value of the bias current may be the configuration value 130. A person skilled in the art will recognize that although here the bias current is described, also another physical parameter may be modulated depending on the sensor arrangement 210 used and that as such also the configuration value 130 may have different forms. It is contemplated that even so here a control unit 270 is depicted, which generates the configuration value 130, also the processing circuit 240 can directly output the configuration value 130 and apply it to the sensor arrangement 210. How a configuration value 130 alters the output 120 of a sensor arrangement is exemplarily shown in FIG. 3.

Figure 3:
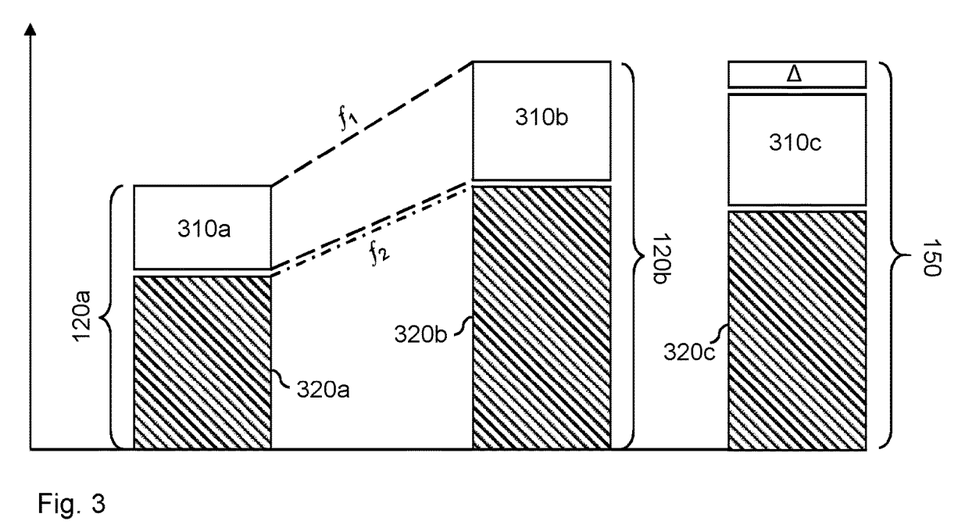
FIG. 3 shows a comparison between an exemplary output of a sensor arrangement with an exemplary reference output.

FIG. 3 depicts on the left hand side an output 120a, which comprises a useable signal 310a and an offset 320a. The offset 320a is an inherent quantity every sensor arrangement has. When a physical parameter of the sensor arrangement is modulated another output 120b is encountered. Also this output 120b comprises a useable signal 310b and an offset 320b. When the behavior of the sensor arrangement is known, the transfer functions $f_1$ and $f_2$ are known. Hence, it is known or as least it is predictable how the useable signal 310a transfers to the useable signal 310b and how the offset 320a transfers to the offset 320b, when the physical parameter is modulated.

Having knowledge about this transfer allows to pre-calculate or pre-model a reference output 150, which should match the output 120b. The matching can be an equal matching or a matching up to a respective error margin, which in the here shown embodiment example is shown as A. The error margin can account for tolerances of the sensor arrangement or limitation in the pre-calculation or pre-modeling, which may be encountered due to memory or processing limitations. However, as long as the difference between the output 120b and the reference output 150 is within the tolerance margin, the comparison will not detect a fault. Once the comparison shows that the output 120b and the reference output 150 do not match, not even within the tolerance margin, a fault in the sensor arrangement is detected, because then the sensor arrangement deviates from a predicted behavior. Also, the amount of deviation can be used to determine the degree of faultiness.

It is evident for a person skilled in the art that when the time difference between the outputs 120a and the output 120b is small enough that only a minuscule change in the sensed physical quantity is encountered, the useable signal 310b as well as the offset 320b can be compared to the expected reference output 150, because then also the transfer between the useable signal 310a and the useable signal 310b can be predicted, such that the useable signal 310b can be compared with the useable signal 310c of the reference output. However, if the time between the output 120a and 120b is larger and the physical quantity to be measured as such is not predictable anymore, only the offset 320b can be compared between the reference offset 320c of the reference signal, because then only this behavior is predictable.

It is clear to a person skilled in the art that the reference output 150 can be one which is pre-calculated or pre-modeled and stored in the memory 245 of processing circuit 240 as depicted in FIG. 2. However, it is also possible that the reference output 150 is an output generated time wise before the output 120b, for example with another modulation of a physical parameter or by ease of another configuration value and that this output is stored in memory 245 as reference output 150. If the output generated afterwards does not match this reference output 150 or does not transfer as predicted, e.g. when the physical parameter is modulated back, then a fault of the sensor arrangement is detected. It will be recognized by the person skilled in the art that there are a lot of different comparisons which can be performed. However, thereby it is important that the transfer between the output and the reference is known or at least in such a way predictable that a deviation can be determined.

Figure 4:
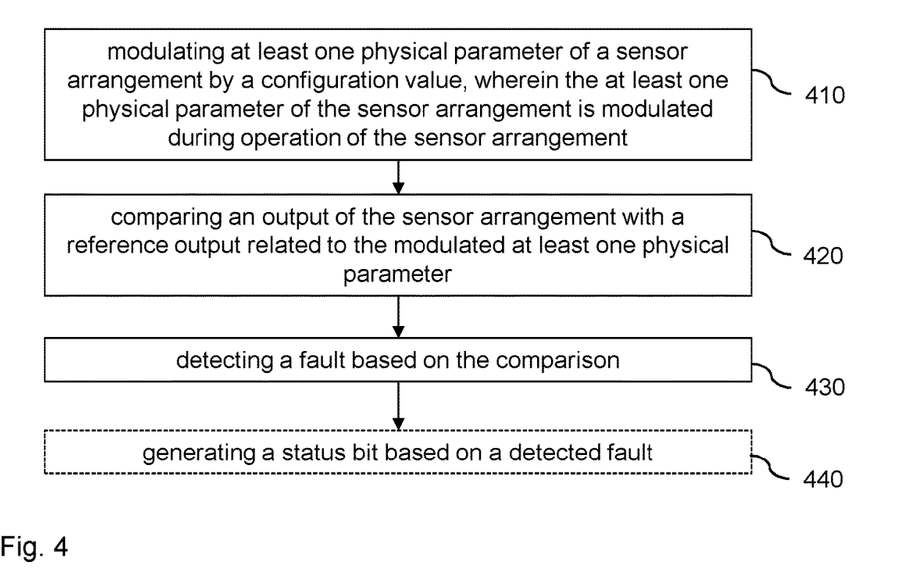
FIG. 4 shows a flow diagram of a method according to the invention for fault detection.

FIG. 4 shows a flow diagram of a method according to the invention for fault detection. In step 410 a physical parameter of a sensor arrangement is modulated by a configuration value. This modulated physical parameter causes the output of the sensor arrangement or at least of a sensing element of the sensor arrangement to change. Thereby, the physical parameter is modulated during operation of the sensor arrangement. In step 420 the output of the sensor arrangement with the modulated physical parameter is compared to a reference output, wherein the reference output is related to the modulated physical parameter. I.e. the reference output represents the output which is expected to be seen, when the physical parameter is modulated by a specific configuration value. This reference output may be pre-calculated, pre-modeled, recorded or stored during an initial test of the sensor arrangement, or may be a former output of the sensor arrangement with another physical parameter modulated, or modulated with a different configuration value. The comparison step thereby evaluates, whether the output with the modulated physical parameter matches the reference output or at least matches the reference output to a certain degree. It can also be evaluated whether an output with no modulated physical parameter transfers correctly when the physical parameter is modulated. As such, it can be assessed, whether the sensor arrangement works properly based on the correct transformation between a state in which the sensor arrangement is not modulated and a state in which the physical parameter is modulated. Based on this comparison, in step 430, either a fault is detected or that the sensor arrangement works properly. Optionally once a fault is detected, in step 440 a status bit can be generated, which indicates the detected fault.

The advantage of the safety function testing according to the current invention is based on the fact that the testing can be performed during operation without having to influence the operation of the sensor arrangement or having to suspend the measuring or sensing of the sensing arrangement. This means, the testing can be performed continuously. Furthermore, performing the test during operation of the sensor arrangement exhibits the advantage that no measurement or sensing bandwidth of the sensor arrangement is compromised, because the measurements or sensing of the actual physical quantity is used to perform the functional safety test.

The invention claimed is:

1. A method for detecting an operational fault in a sensor arrangement, the method comprising:
   modulating at least one physical parameter of the sensor arrangement by a configuration value, wherein the at least one physical parameter of the sensor arrangement is modulated during operation of the sensor arrangement;
   comparing an output of the sensor arrangement with a reference output related to the modulated at least one physical parameter; and
   detecting an operational fault in the sensor arrangement based on the comparison, wherein the operational fault is detected when the output deviates from the reference output, and
   wherein
      the reference output is a stored output that has been stored before being compared to the output, or
      the output is a modulated output using a modulation of a first physical parameter of the sensor arrangement with a first configuration value and the reference output is a modulated output using a modulation of the first physical parameter of the sensor arrangement with a second configuration value.

2. The method of claim 1, further comprising:
   generating a status bit based on the detected operational fault.

3. The method of claim 1, wherein the reference output is a stored output.

4. The method of claim 1, wherein the output of the sensor arrangement is a modulated output using a modulation of a first physical parameter of the sensor arrangement with a first configuration value and the reference output is a modulated output using a modulation of the first physical parameter of the sensor arrangement with a second configuration value.

5. The method of claim 1, wherein the output of the sensor arrangement is a modulated output using a modulation of a first physical parameter of the sensor arrangement and the reference output is a modulated output using a modulation of a second physical parameter of the sensor arrangement.

6. The method of claim 1, wherein comparing the output of the sensor arrangement with the reference output of the sensor arrangement comprises:
   comparing a set of outputs with a set of reference outputs.

7. The method of claim 1, wherein detecting the operational fault comprises:
   detecting a fault, when the output differs from the reference output by more than a predetermined threshold.

8. A processing circuit, comprising:
   a modulator configured to modulate at least one physical parameter of a sensor arrangement by a configuration value, wherein the at least one physical parameter of the sensor arrangement is modulated during operation of the sensor arrangement;
   a comparator configured to compare an output of the sensor arrangement with a reference output related to the modulated at least one physical parameter; and
   a detector configured to detect an operational fault in the sensor arrangement based on the comparison, wherein the operational fault is detected when the output deviates from the reference output, and
   wherein
      the reference output is a stored output that has been stored before being compared to the output, or
      the output is a modulated output using a modulation of a first physical parameter of the sensor arrangement with a first configuration value and the reference output is a modulated output using a modulation of the first physical parameter of the sensor arrangement with a second configuration value.

9. The processing circuit of claim 8, wherein the at least one physical parameter is modulated all the time during operation.

10. The processing circuit of claim 8, wherein the modulator is adapted to modulate a first physical parameter with at least a first configuration value during a first period of time and to modulate a second physical parameter with at least a second configuration value during a second period of time.

11. The processing circuit of claim 8, further comprising:
   a generator configured to generate a status bit based on the detected operational fault.

12. The processing circuit of claim 8, wherein the at least one physical parameter is modulated intermittently during operation.

13. A system comprising:
   a processing circuit according to claims 8; and
   a sensor arrangement.

14. The system of claim 13, wherein the sensor arrangement comprises at least one magnetic sensing element.

15. The system of claim 14, wherein the sensor arrangement comprises at least one Hall sensing element.

16. The system of claim 13, further comprising:
   a readout chain between the sensor arrangement and the processing circuit.

17. The system of claim 13, wherein the sensor arrangement comprises at least a bridge circuit.

18. The system of claim 14, wherein the sensor arrangement comprises at least a magnetoresistance sensing element.

* * * * *